(12) United States Patent
Tan et al.

(10) Patent No.: US 9,136,325 B2
(45) Date of Patent: Sep. 15, 2015

(54) DEVICE STRUCTURE FOR REDUCING LEAKAGE CURRENT OF SEMICONDUCTOR DEVICES WITH FLOATING BURIED LAYER

(71) Applicant: China Electronic Technology Corporation, 24th Research Institute, Chongqing (CN)

(72) Inventors: Kai-Zhou Tan, Chongqing (CN); Zhao-Huan Tang, Chongqing (CN); Rong-Kan Liu, Chongqing (CN); Yong Liu, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 0 days.

(21) Appl. No.: 14/463,657

(22) Filed: Aug. 19, 2014

(65) Prior Publication Data

US 2015/0054119 A1 Feb. 26, 2015

(30) Foreign Application Priority Data

Aug. 22, 2013 (CN) .......................... 2013 1 0370379

(51) Int. Cl.
*H01L 29/66* (2006.01)
*H01L 29/15* (2006.01)
*H01L 27/07* (2006.01)
(Continued)

(52) U.S. Cl.
CPC .......... *H01L 29/0638* (2013.01); *H01L 29/063* (2013.01)

(58) Field of Classification Search
CPC ............ H01L 29/0634; H01L 29/7835; H01L 29/0615; H01L 29/0847; H01L 29/06; H01L 21/329; H01L 29/861; H01L 29/0638; H01L 29/063
USPC ..................... 257/493, 477, 77, 495, E29.104
See application file for complete search history.

(56) References Cited

U.S. PATENT DOCUMENTS

| 5,034,337 A * | 7/1991 | Mosher et al. ................. 438/220 |
| 5,614,755 A * | 3/1997 | Hutter et al. ................... 257/471 |
| 2003/0015765 A1* | 1/2003 | Yamashita et al. ............ 257/477 |

(Continued)

OTHER PUBLICATIONS

Yagong Nan, Zhirong Zhang and Zuo Zhou, "Study on Temperature Properties of 4 H—SiC Doubled-Floating Junction Schottky Barrier Diodes", Microelectronics, Feb. 2011, pp. 146-149, vol. 41, Issue No. 1; China Academic Journal Electronic Publishing House; China.

(Continued)

*Primary Examiner* — Long K Tran
*Assistant Examiner* — Dzung Tran
(74) *Attorney, Agent, or Firm* — Cheng-Ju Chiang

(57) ABSTRACT

A device structure is provided to reduce the leakage current of semiconductor devices with a floating buried layer (FBL), includes a substrate, a first epitaxial layer, a split floating buried layer, a second epitaxial layer, a doped trench, a protected device, a surface junction termination extension (S-JTE) and a scribe street. The device and the S-JTE are designed at the second epitaxial layer and the split floating buried layer at the joint of the first and second epitaxial layers. The doped trench is penetrated through the second epitaxial layer and connected to the split floating buried layer. The substrate, the first and second epitaxial layers feature the same typed doping which is opposite to that of split floating buried layer and doped trench.

5 Claims, 4 Drawing Sheets

(51) Int. Cl.
*H01L 29/02* (2006.01)
*H01L 29/06* (2006.01)

(56) References Cited

U.S. PATENT DOCUMENTS

| | | | |
|---|---|---|---|
| 2003/0045035 A1* | 3/2003 | Shenai et al. | 438/142 |
| 2005/0045982 A1* | 3/2005 | Shenai | 257/481 |
| 2007/0120153 A1* | 5/2007 | Williams et al. | 257/280 |
| 2008/0001159 A1* | 1/2008 | Ota et al. | 257/77 |
| 2012/0205666 A1* | 8/2012 | Henning et al. | 257/77 |

OTHER PUBLICATIONS

Wataru Saitoh, Ichiro Omura, Ken'ichi Tokano, Tsuneo Ogura and Hiromichi Ohashi, "Ultra Low On-Resistance SBD with P-Buried Floating Layer", Power Semiconductor Devices and ICs, 2002, pp. 33-36, IEEE, Japan.

Johji Nishio, Chiharu Ota, Tetsuo Hatakeyama, Takashi Shinohe, Kazutoshi Kojima, Shin-Ichi Nishizawa, and Hiromichi Ohashi, "Ultralow-Loss SiC Floating Junction Schottky Barrier Diodes (Super-SBDs)", IEEE Transactions on Electron Devices, Aug. 2008, pp. 1954-1960; vol. 55, Issue No. 8; IEEE, Japan.

Ya-Gong Nan, Hong-Bin Pu, Lin Cao and Jie Ren, "Study and Optimal Simulation of 4H—SiC Floating Junction Schottky Barrier Diodes' Structures and Electric Properties", Chinese Physics. B, 2010, pp. 107304-1 to 107304-5, vol. 19, Issue No. 10; Chinese Physical Society and IOP Publishing Ltd., China.

* cited by examiner

DEVICE STRUCTURE FOR REDUCING LEAKAGE CURRENT OF SEMICONDUCTOR DEVICES WITH FLOATING BURIED LAYER

1. FIELD OF THE INVENTION

The invention relates to semiconductor devices and integrated circuit technologies, particularly to a structure being provided to reduce the leakage current of semiconductor devices with Floating Buried Layer (FBL).

2. DESCRIPTION OF RELATED ART

As for designing a high voltage semiconductor silicon device, there's a trade-off between sustaining high breakdown voltage and obtaining low on-resistance. That is to say, it's difficult to realize both. Targeting the conventional device structure, various methods have been proposed to decrease on-resistance and sustain high breakdown voltage in the industry. One of well-known structures is the structure of Super Junction (SJ). The structure requires rigorous depletion space charge balance between N-typed and P-typed drift regions, as 5% unbalanced charges leads to greatly-decreased breakdown voltage. RESURF technology has been used for decreasing on-resistance and sustain high breakdown voltage by adding double or triple RESURF layers to LDMOS, trench-gate Schottky diode, trench-gate VDMOS and trench-gate IGBT, etc. The last one, being less discussed, is Split Buried Floating Layer (SBFL). Still, we can find references in several publications, such as "Ultra Low On-resistance SBD with P-buried Floating Layer" by Saitoh W. in Power Semiconductor Devices and ICs, Proceedings of the 14th International Symposium, June 2002, "Ultra low-loss SiC Floating Junction Schottky Barrier Diodes (Super-SBDs)" by Johji Nishio in IEEE transactions on Electron Device, Vol. 55(8) page 1954-1960, August 2008, "Study on Temperature Properties of 4H-SiC Doubled-Floating Junction Schottky Barrier Diodes" by NAN Yagong in Microelectroics, page 146-149, February 2011, and "Study and Optimal Simulation of 4H-SiC Floating Junction Schottky Barrier Diodes' Structures and Electric Properties" by Chin. Phys. B Vol. 19(10), page 107304-1, 2010.

The results say that the SJ structure works better than the trench-gate structure and devices with three or below RESURF layers. To the limit, a multiple split floating buried layer structure theoretically takes as much merit as SJ structure does. Practically, SJ structure draws more attentions on research and application in the practice. And SBFL structure can find major applications in SiC devices.

Being more sensitive to charge balance against SBFL structure, the SJ structure are more complicated than the SBFL structure in fabrication, as the SBFL structure features fewer epitaxial layers.

As the conventional split floating buried layer extends to scribe street, its depletion space charge layer shall be overlapped by defected region around Scribe Street. In that way, reverse leakage current takes place in SBFL device at reverse high voltage. Therefore, a method to reduce leakage current of semiconductor devices with Floating Buried Layer (FBL) is proposed.

3. BRIEF SUMMARY OF THE INVENTION

It is an object of the invention to propose a method to reduce leakage current of semiconductor devices with Floating Buried Layer (FBL).

The foregoing objects of the invention are accomplished as follows:

A structure being designed to reduce the leakage current of FBL devices, comprising a semiconductor substrate, a first epitaxial layer, a split floating buried layer, a second epitaxial layer, a doped trench, a protected device, a S-JTE and a scribe street.

Then, the semiconductor substrate, the first epitaxial layer and the second epitaxial layer feature the same typed doping which is opposite to that of the split floating buried layer and the doped trench.

Then, the protected device and the S-JTE are designed at the second epitaxial layer and the split floating buried layer at the joint of the first and second epitaxial layers; the doped trench is penetrated through the second epitaxial layer and connected to the split floating buried layer.

Then, a slot space of the split floating buried layer is no larger than 8% of the thickness of maximum depletion layer of ideal parallel-plane abrupt junction at a specific voltage, the space between the doped trench and the S-JTE is no less than 25% of the thickness of maximum depletion layer of ideal parallel-plane abrupt junction at a specific voltage, the length between the slot of split floating buried layer and the left side of doped trench is no less than 25% of the thickness of maximum depletion layer of ideal parallel-plane abrupt junction at a specific voltage, the length between the right end of split floating buried layer and the right side of doped trench is no less than 30% of the thickness of maximum depletion layer of ideal parallel-plane abrupt junction at a specific voltage.

Then, the space between the split floating buried layer and the scribe street is no less than 20% of the thickness of maximum depletion layer of ideal parallel-plane abrupt junction at a specific voltage.

Then, the first epitaxial layer and the second epitaxial layer feature the identical impurity doping concentration which is from 1.7 to 2.2 times that of the lower-doped region of ideal parallel-plane abrupt junction at a specific voltage.

Then, the thickness of the first epitaxial layer is from 35% to 50% of the thickness of the maximum depletion layer of ideal parallel-plane abrupt junction at a specific voltage, the thickness of second epitaxial layer is from 45% to 55% of the thickness of the maximum depletion layer of ideal parallel-plane abrupt junction at a specific voltage.

The invention has following advantages:

1. Compared with the conventional SBFL device, the structure, featuring low on-resistance and high breakdown voltage, tends to prevent from reverse leakage current when the depletion space charge layer is overlapped by defect region of Scribe Street.

2. A few changes are made during the process for SBFL structure including adding one trench doping and modifying the layout of split floating buried layer at little cost.

3. The novel SBFL structure features a high reliability for a long run as the overlapping of the depletion layer and defect region around Scribe Street is avoided.

4. BRIEF DESCRIPTION OF THE DRAWINGS

5. DETAILED DESCRIPTION OF THE INVENTION

Hereinafter, the preferred embodiments of the present invention will be described with the accompanying drawings. It should be understood that the following embodiments are provided just for describing the invention, instead of limiting the property protection scope of the invention.

Figure 1:
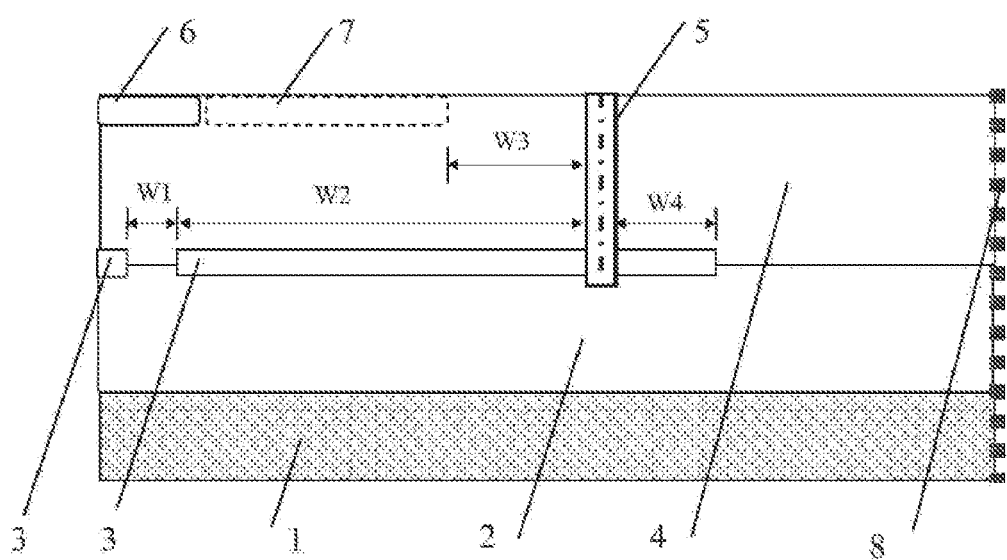
FIG. 1 is a cross section of an SFBL structure being designed to reduce the leakage current.

A 600V diode is embodied as an example of the protected device 6. It should be understood that the referred embodiment is provided just for describing the invention, instead of limiting the scope of the invention. As shown in FIG. 1, the protected device can be any one of devices such as bipolar transistor, MOSFET, VDMOS, IGBT and integrated circuits.

As the structure of the protected device is symmetrical, the whole structure can be presented by symmetrically-copying the right half part of the structure. The cross section of the right half part of the whole structure is shown in FIG. 1 being illustrated for the referred embodiment of the invention.

A 600V diode is taken as an example for describing the structure of the invention.

Step 1: An N-typed silicon wafer 100 of 0.02-0.001 Ω·cm is aligning-marked according the industry practice.

Figure 2:
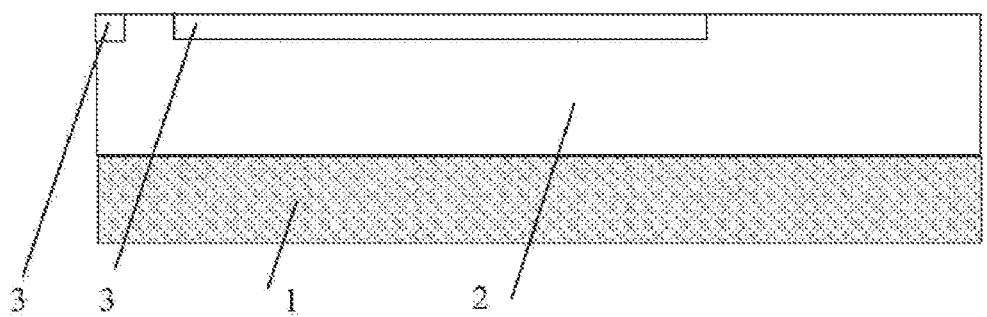
FIG. 2 is a cross section of a structure with first epitaxial and a split floating buried layer.

Step 2: According to the requirement of breakdown voltage of 600V diode and industry standards N-typed first epitaxial layer 2 is grown over the silicon substrate with doping concentration of $5.8\times10^{14}/cm^3$ which is from 1.7 to 2.2 times that of the lower-doped region of ideal parallel-plane abrupt junction. As shown in FIG. 1 and FIG. 2, its thickness is 25 μm, the 47% of the thickness of maximum depletion layer of ideal parallel-plane abrupt junction which is within the range from 35% to 50%.

Step 3: 40 nm oxide layer is formed during dry oxidation process. The split floating buried layer 3 is masked by photolithography techniques. The slot space W1 of split floating buried layer 3 is 4 μm, the 7.5% of the thickness of maximum depletion layer of ideal parallel-plane abrupt junction which is below 8%. The space between the split floating buried layer and Scribe Street 8 is 15 μm, the 28% of the thickness of maximum depletion layer of ideal parallel-plane abrupt junction as shown in FIG. 1 and FIG. 2.

Step 4: Following Step 3, boron is then implanted with energy of 80 KeV and dosage of $1.0\times10^{13}/cm^2$.

Step 5: Annealing process is carried out after step 4 to activate the implanted ions in an ambient containing N2. The annealing temperature is on the order of 950° C. and the annealing time is on the order of 20 min as shown in FIG. 1 and FIG. 2.

Step 6: Following Step 5, the oxide layer is then removed and the second N-type epitaxial layer 4 is then formed featuring doping concentration of $5.8\times10^{14}/cm^2$ and the thickness of 27 μm, the 51% of the thickness of maximum depletion layer.

Figure 3:
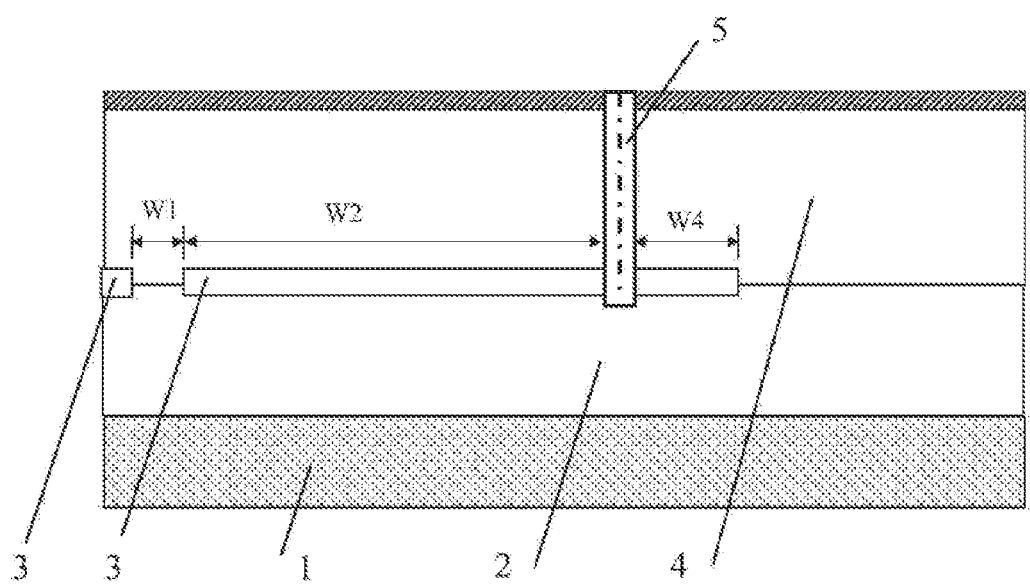
FIG. 3 is a cross section of the structure as shown in FIG. 2 with second epitaxial layer and doped trench.

Step 7: Based on Step 6, the wet oxidation proceeds and is used to grow an oxide layer of 600 nm. Using standard deep trench etching process, the deep trench 5 of 31 μm deep and 1.5 μm wide is created being penetrated through the floating buried layer 3. The space W2 between the left side wall of the deep trench 5 and the slot is 62 μm and the space W4 between the right side wall of the deep trench 5 and the right end of floating buried layer 3 is 21 μm as shown in FIG. 1 and FIG. 3.

Step 8: After Step 7, according to the industry practice, the polymer is removed in the solution of 100:1HF for 30 sec. Using industry standard cleaning, the wafer is cleaned in the Solution 1(NH3:H2O2:H2O=1:2:7) and Solution 2(HCl:H2O2:H2O=1:2:7). Then the oxide layer on the sidewall of the trench is removed using 100:1 HF solution for 15 sec. The oxide over the silicon surface is kept. And the boron is then diffused to obtain sheet resistance less than 100Ω per square.

Step 9: Based on Step 8, an oxide layer of 100 nm is grown using dry oxidation. After the oxide deposition on the sidewall of the deep trench 5, the deep trench is filled with poly-silicon using standard LPCVD technique. As for the deep trench 5 of 1.5 μm, the thickness of poly-silicon is usually 1 μm. The poly-silicon over the surface is then removed using traditional CMP technique. The residual oxide is then removed as shown in FIG. 1 and FIG. 3.

Step 10: Following Step 9, an oxide layer of 70 nm is deposited using dry oxidation. The p+ region of 3 μm is open for diode 6 (the protected device 6) using photolithography technique. The boron is implanted through film with energy of 60 KeV and dose of $2\times10^{15}/cm^2$.

Figure 4:
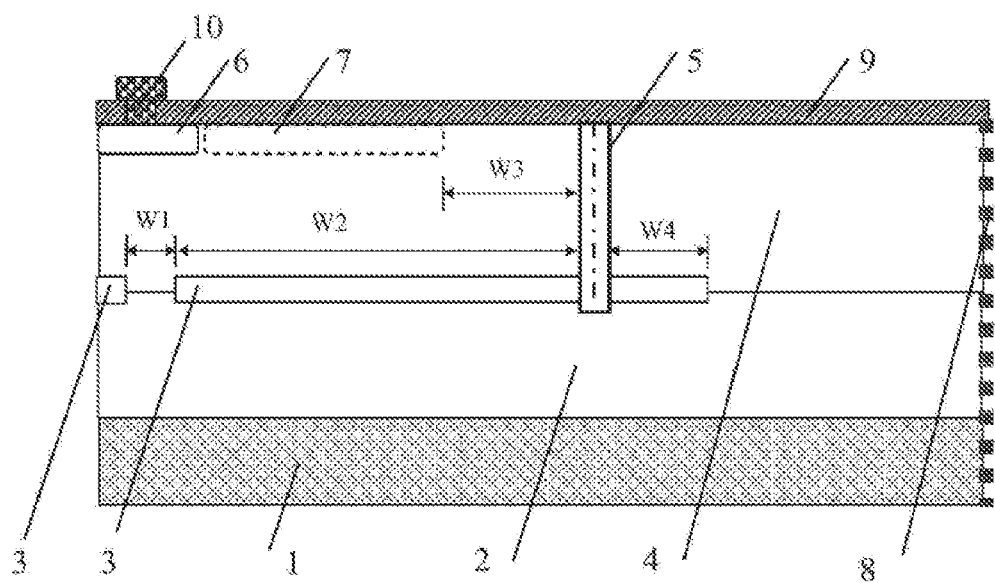
FIG. 4 is a cross section of the structure as shown in FIG. 3 with the protected device, S-JTE, surface oxidation layer and metallization layer.

Step 11: As for the region of S-JTE 7, any well known high voltage structure can be applied to this region. A proper RESURF structure is chosen for the referred embodiment being fabricated in following process: after photolithography, the S-JTE region is open with the space of 38 μm. The space between diode and S-JTE is 1 μm. The space W3 between deep trench 5 and S-JTE is 24 μm. The boron is then implanted with energy of 80 KeV and dose of $1.8\times10^{12}/cm^2$. Following that, the photoresist is removed and the wafer is cleaned. The wafer is then annealed for 20 min at 950° C. in an ambient containing N2, as shown in FIG. 4.

Step 12: After Step 11, a silicon oxide layer of 600 nm is deposited using LPCVD process. A via is etched for P-typed contact of diode using photolithography. A metal layer 10 of 1.2 μm is formed using spattering technique. The last process is alloy for the referred embodiment as shown in FIG. 4.

The results show that the invention tends to provide a 600V diode featuring of epitaxial layers of 41.7 mΩ·cm2 which is 56% of 73.3 mΩ·cm2 of specific on-resistance of ideal parallel-plane abrupt junction. Compared with the convention SBFL structure, the presented structure tends to prevent from leakage current near Scribe Street and features high reliability.

The processes are mentioned above for describing major steps of the method, ignoring minor processes which are well known by technologists in the field.

The foregoing preferred embodiments are provided to describe, not to limit, technical approaches in the present invention. Obviously, bearing the essence and concept of the present invention, technologists in this field can make various changes and redesigns to the present invention. It should be understood that those changes and redesigns are also covered by claims of the present invention, if they are with the same purpose and within the same scope of the present invention.

What is claimed is:

1. A device structure for reducing leakage current of semiconductor devices with a floating buried layer, comprising: a semiconductor substrate, a first epitaxial layer, a split floating buried layer, a second epitaxial layer, a doped trench, a protected device, a surface junction termination extension (S-JTE) and a scribe street; the protected device and the S-JTE are designed at the second epitaxial layer and the split floating buried layer at the joint of the first and second epitaxial layers; the doped trench is penetrated through the second epitaxial layer and connected to the split floating buried layer, the first epitaxial layer is located on the semiconductor substrate, a space between the split floating buried layer and the scribe street is no less than 20% of the thickness of maximum depletion layer of ideal parallel-plane abrupt junction at a specific voltage.

2. The device structure for reducing leakage current of semiconductor devices with a floating buried layer as recited in claim 1, wherein the semiconductor substrate, the first epitaxial layer, and the second epitaxial layer feature the same typed doping which is opposite to that of the split floating buried layer and the doped trench.

3. The device structure for reducing leakage current of semiconductor devices with a floating buried layer as recited in claim 1, wherein a slot space of the split floating buried layer is no larger than 8% of the thickness of maximum depletion layer of an ideal parallel-plane abrupt junction at a specific voltage, a space between the doped trench and the S-JTE is no less than 25% of the thickness of maximum depletion layer of ideal parallel-plane abrupt junction at a specific voltage, the length between the slot of split floating buried layer and the left side of the doped trench is no less than 25% of the thickness of maximum depletion layer of an ideal parallel-plane abrupt junction at a specific voltage, the length between the right end of the split floating buried layer and the right side of the doped trench is no less than 30% of the thickness of the maximum depletion layer of ideal parallel-plane abrupt junction at a specific voltage.

4. The device structure for reducing leakage current of semiconductor devices with a floating buried layer as recited in claim 1, wherein the first epitaxial layer and the second epitaxial layer feature the identical impurity doping concentration which is from 1.7 to 2.2 times that of the lower-doped region of ideal parallel-plane abrupt junction at a specific voltage.

5. The device structure for reducing leakage current of semiconductor devices with a floating buried layer as recited in claim 1, wherein the thickness of first epitaxial layer is from 35% to 50% of the thickness of the maximum depletion layer of ideal parallel-plane abrupt junction at a specific voltage, the thickness of second epitaxial layer is from 45% to 55% of the thickness of the maximum depletion layer of ideal parallel-plane abrupt junction at a specific voltage.

* * * * *